United States Patent
Iijima et al.

(10) Patent No.: US 8,565,004 B2
(45) Date of Patent: Oct. 22, 2013

(54) NONVOLATILE MEMORY DEVICE AND METHOD FOR PROGRAMMING THE SAME

(75) Inventors: Mitsuteru Iijima, Osaka (JP); Takeshi Takagi, Kyoto (JP); Koji Katayama, Nara (JP)

(73) Assignee: Panasonic Corporation, Osaka (JP)

( * ) Notice: Subject to any disclaimer, the term of this patent is extended or adjusted under 35 U.S.C. 154(b) by 181 days.

(21) Appl. No.: 13/379,463

(22) PCT Filed: Jun. 28, 2011

(86) PCT No.: PCT/JP2011/003670
§ 371 (c)(1),
(2), (4) Date: Dec. 20, 2011

(87) PCT Pub. No.: WO2012/001944
PCT Pub. Date: Jan. 5, 2012

(65) Prior Publication Data
US 2012/0170353 A1 Jul. 5, 2012

(30) Foreign Application Priority Data
Jun. 29, 2010 (JP) .................................. 2010-148289

(51) Int. Cl.
*G11C 11/00* (2006.01)
(52) U.S. Cl.
USPC ........................................................ 365/148
(58) Field of Classification Search
None
See application file for complete search history.

(56) References Cited

U.S. PATENT DOCUMENTS

| | | | |
|---|---|---|---|
| 7,433,222 B2 * | 10/2008 | Hosoi et al. | 365/148 |
| 2006/0268594 A1 * | 11/2006 | Toda | 365/100 |
| 2007/0165442 A1 | 7/2007 | Hosoi et al. | |
| 2009/0052225 A1 | 2/2009 | Morimoto | |
| 2010/0008125 A1 | 1/2010 | Inaba | |
| 2011/0103132 A1 | 5/2011 | Wei et al. | |

FOREIGN PATENT DOCUMENTS

| | | | |
|---|---|---|---|
| JP | 2006-203098 | | 8/2006 |
| JP | 2007-188603 | | 7/2007 |
| JP | 2010-020811 | * | 8/2008 |
| JP | 2010-020811 | | 1/2010 |
| WO | 2010/140296 | | 12/2010 |
| WO | 2011/004448 | | 1/2011 |

OTHER PUBLICATIONS

International Search Report issued Aug. 2, 2011 in International (PCT) Application No. PCT/JP2011/003670.

* cited by examiner

*Primary Examiner* — Huan Hoang
*Assistant Examiner* — James G Norman
(74) *Attorney, Agent, or Firm* — Wenderoth, Lind & Ponack, L.L.P.

(57) ABSTRACT

A method for programming a nonvolatile memory device according to the present invention includes a step of detecting an excessively low resistance cell from among a plurality of memory cells (11) (S101); a step of changing the resistance value of a load resistor (121) to a second resistance value smaller than a first resistance value (S103); and a step of causing, by applying a voltage pulse to a series circuit including the excessively low resistance cell and the load resistor (121) having the second resistance value, a variable resistance element (105) included in the excessively low resistance cell to shift to a second high resistance state having a resistance value greater than that of the first low resistance state (S104).

10 Claims, 8 Drawing Sheets

NONVOLATILE MEMORY DEVICE AND METHOD FOR PROGRAMMING THE SAME

TECHNICAL FIELD

The present invention relates to nonvolatile memory devices and methods for programming the same, and in particular to a nonvolatile memory device that has diodes, and variable resistance elements that reversibly change between a low resistance state and a high resistance state having a resistance value greater than that of the low resistance state, due to application of a voltage pulse, and a method for programming the same.

BACKGROUND ART

In recent years, electronic devices such as portable information devices and information home appliances are achieving higher functionality, with the progress of digital technology. With an increase in the functionality of such electronic devices, rapid progress has been made in miniaturization of semiconductor devices used therefor and increase in the speed thereof. Especially, the use application of nonvolatile memory with a large capacity as represented by flash memory has been rapidly expanded. Furthermore, development of a variable resistance semiconductor memory device (ReRAM) using a so-called variable resistance element is now in progress, as a new nonvolatile memory for the next generation that replaces the above flash memory.

Here, a variable resistance element is an element that has a property that a resistance value reversibly changes due to an electrical signal, and is further capable of storing information corresponding to this resistance value in a nonvolatile manner. The resistance value of a phase change element (PCRAM) changes due to a crystal condition being changed by heat generated by an electric stimulus. On the other hand, unlike the phase change element (PCRAM), the resistance value of a variable resistance element is changed due to a change between the oxidation and reduction states of variable resistance material, which is directly caused by an electric stimulus, that is, via a transfer of electron.

As an example of a semiconductor memory device with a large capacity including such a variable resistance element, a crosspoint semiconductor memory device is known. In the case of such crosspoint ReRAM, a diode is inserted in a nonvolatile memory element of each memory cell in series (e.g., see Patent Literature 1). Accordingly, when the resistance value of a selected nonvolatile memory element (memory cell) that is formed at a crosspoint at which a word line and a bit line are three-dimensionally intersected with each other is read, the influence of a current that flows through a memory element that is not selected (sneak current) can be avoided.

FIG. 10 shows a semiconductor memory device including conventional variable resistance elements. The semiconductor memory device shown in FIG. 10 is a crosspoint memory cell array having bit lines 210, word lines 220, and memory cells 280 each of which is formed at a crosspoint of the lines. Further, the memory cells 280 are each formed by connecting, in series, a variable resistance element 260 that stores information according to a change in the electrical resistance due to electrical stress, and a two-terminal diode 270 that allows a current to flow bidirectionally and has a nonlinear current-voltage characteristic. The bit lines 210 that are upper wiring are electrically connected with the diodes 270, and the word lines 220 that are lower wiring are electrically connected with the variable resistance elements 260. Since a current bidirectionally flows into the diodes 270 when the memory cells 280 are rewritten, an increase in the capacity can be achieved by using diodes (such as varistors) with a nonlinear current-voltage characteristic with respect to both polarity directions of applied voltage (both of the positive and negative voltage sides), for example.

A semiconductor memory device is also proposed in which a variable load resistor is connected to crosspoint ReRAM (e.g., see Patent Literature 2).

FIG. 11 is a block diagram showing a relationship among a variable resistance element of a selected memory cell, a load circuit, and a peripheral circuit of a conventional semiconductor memory device.

A high resistance state and a low resistance state of the semiconductor memory device shown in FIG. 11 can be stabilized by changing the resistance value of the load circuit, in the rewriting of data to a memory cell.

CITATION LITERATURE

Patent Literature

[PTL 1] Japanese Unexamined Patent Application Publication No. 2006-203098

[PTL 2] Japanese Unexamined Patent Application Publication No. 2007-188603

SUMMARY OF INVENTION

Technical Problem

However, in the crosspoint memory cell array using diodes as described in Patent Literature 1, a large current flows into a diode due to a voltage pulse applied to a memory cell. Accordingly, dielectric breakdown occurs in the diode, and the diode is thereby substantially short-circuited, which may cause a defect in the memory cell.

When a defect as described above occurs in a memory cell, the memory cell substantially becomes short-circuited (shifts to a state in which the resistance value drops greatly, which is hereinafter referred to as excessively low resistance state). Accordingly, all the currents that flow when other memory cells in the same row or column as that having the defective memory cell are accessed will flow into the defective memory cell that is substantially short-circuited. As a result, writing to or reading from other memory cells in the same row or column as that having the defective memory cell cannot be properly performed, which is a problem.

It is disclosed that with the rewriting method using a variable load circuit as described in Patent Literature 2, in order to stably change the resistance of a unipolar variable resistance element, a load resistor connected to the variable resistance element in series is switched, and writing operation is performed. However, the above excessively low resistance state is not expected to occur, and a countermeasure thereagainst is not shown, either.

Further, when a bipolar variable resistance element is changed from a high resistance state to a low resistance state, a predetermined load resistor may be connected in series in advance with a variable resistance element, and the resistance may be changed, in order to suppress generation of an excessive current due to a phenomenon of a rapid decrease in resistance. However, for example, when a memory cell has shifted to the excessively low to resistance state as described above, even if rewriting voltage is applied to the memory cell, most of the applied voltage will be applied to the load resistor, and thus voltage necessary for rewriting cannot be effectually applied to the variable resistance element. As a result, a problem arises that the element cannot be restored from the excessively low resistance state.

The present invention has been conceived to solve the above problems, and an object thereof is to provide a nonvolatile memory device and a method for programming the same that enable, even when a defect occurs in a nonvolatile memory element, effective prevention of a state in which writing to or reading from other nonvolatile memory elements in the same row or column as that having the defective nonvolatile memory element cannot be performed.

Solution to Problem

In order to achieve the above object, a method for programming a nonvolatile memory device according to an aspect of the present invention is a method for programming a nonvolatile memory device including a plurality of memory cells each of which includes a diode with a nonlinear current-voltage characteristic and a variable resistance element connected to the diode in series, and a variable load resistor connected to the memory cells in series, the variable resistance element being reversibly changed between a first high resistance state and a first low resistance state by applying a first resistance-decreasing electrical pulse to a series circuit including corresponding one of the memory cells and the variable load resistor having a first resistance value so as to change the variable resistance element from the first high resistance state to the first low resistance state, and by applying a first resistance-increasing electrical pulse to the series circuit so as to change the variable resistance element from the first low resistance state to the first high resistance state, the method including: detecting, from among the memory cells, an excessively low resistance cell including a variable resistance element in a second low resistance state having a resistance value smaller than a resistance value of the first low resistance state; changing a resistance value of the variable load resistor from the first resistance value to a second resistance value smaller than the first resistance value; and causing the variable resistance element included in the excessively low resistance cell to shift from the second low resistance state to a second high resistance state having a resistance value greater than the resistance value of the first low resistance state, by applying a second resistance-increasing electrical pulse to a series circuit including the excessively low resistance cell and the variable load resistor having the second resistance value.

According to this, the method for programming a nonvolatile memory device according to the aspect of the present invention allows detection of a memory cell in which a defect has occurred due to a diode being substantially short-circuited (excessively low resistance cell). Furthermore, with the programming method, the resistance value of the variable load resistor is decreased, and then a voltage pulse is applied to the detected excessively low resistance cell, thereby increasing the resistance of that memory cell. Accordingly, most of the voltage applied to the excessively low resistance cell to increase the resistance is applied to the variable resistance element, rather than to the variable load resistor, and thus the resistance of the variable resistance element can be increased. Therefore, the excessively low resistance cell can be brought out of the excessively low resistance state, and thus it is possible to prevent an excessive current from flowing into the defective memory cell when a current is caused to flow through the same row or column as that having the memory cell that has become defective. Accordingly, the other memory cells are allowed to normally operate.

In this manner, with the method for programming a nonvolatile memory device according the aspect of the present invention, even when a defect has occurred in a nonvolatile memory element, it is possible to effectively prevent a state in which writing to or reading from other nonvolatile memory elements in the same row or column as that having the defective nonvolatile memory element cannot be performed.

Further, "when a diode is substantially short-circuited" means when a diode has shifted to a state in which the resistance value thereof becomes smaller than the resistance value of the diode in the ON state during the normal time, due to dielectric breakdown.

Further, the resistance value of the second high resistance state may be greater than a resistance value of the first high resistance state.

According to this, with the method for programming a nonvolatile memory device according to the aspect of the present invention, a current that flows into the defective memory cell can be further reduced, and thus it is possible to further prevent a state in which writing to or reading from other nonvolatile memory elements in the same row or column as that having the defective nonvolatile memory element cannot be performed.

Further, the causing the variable resistance element to shift may include: applying the second resistance-increasing electrical pulse to the series circuit including the excessively low resistance cell and the variable load resistor having the second resistance value; reading a resistance value of the excessively low resistance cell after the applying; determining whether or not the variable resistance element included in the excessively low resistance cell is in the second high resistance state, as a result of the reading; changing the resistance value of the variable load resistor to a third resistance value smaller than the second resistance value, when it is determined in the determining that the excessively low resistance cell is not in the second high resistance state; and causing the excessively low resistance cell to shift to the second high resistance state by applying the second resistance-increasing electrical pulse to the series circuit including the excessively low resistance cell and the variable load resistor having the third resistance value, and the causing the variable resistance element to shift including from the applying to the causing the excessively low resistance cell to shift may be repeated until it is determined in the determining that the variable resistance element included in the excessively low resistance cell is in the second high resistance state.

According to this, with the method for programming a nonvolatile memory device according to the aspect of the present invention, even when the resistance of the defective memory cell cannot be increased, the resistance of the defective memory cell can be increased by increasing the resistance using the variable load resistor having the second resistance value.

Further, the variable load resistor may include a transistor, and in the changing of the resistance value to the second resistance value, the resistance value of the variable load resistor may be changed to a smaller resistance value by changing a gate voltage of the transistor.

According to this, with the method for programming a nonvolatile memory device according to the aspect of the present invention, the resistance value of the load resistor connected to the memory cells can be easily changed.

Further, the method for programming a nonvolatile memory device may further include changing the resistance value of the variable load resistor from a resistance value smaller than the first resistance value to the first resistance value, after the causing the variable resistance element to shift.

According to this, with the method for programming a nonvolatile memory device according to the aspect of the present invention, normal writing and reading operations can be performed in subsequent processing.

Further, each of the memory cells may store only binary data represented by a first logical value corresponding to the first high resistance state and a second logical value corresponding to the first low resistance state.

A nonvolatile memory device according to an aspect of the present invention includes a plurality of first lines arranged parallel to a main surface of a substrate at predetermined intervals in a first direction; a plurality of second lines arranged parallel to the main surface of the substrate at predetermined intervals in a second direction, so as to three-dimensionally intersect with the first lines; a memory cell array including a plurality of memory cells each of which includes a diode with a nonlinear current-voltage characteristic and a variable resistance element connected to the diode in series, and has two terminals respectively connected to one of the first lines and one of the second lines, the memory cells being respectively disposed at crosspoints of the first lines and the second lines; a row selection circuit with a driver and a column selection circuit with a driver that select one of the memory cells included in the memory cell array, and apply a predetermined write voltage and a predetermined read voltage to the selected memory cell; a sense amplifier that reads a resistance value of the selected memory cell; and a variable load resistor connected to the memory cell array in series, wherein the variable resistance element included in the selected memory cell changes from a first low resistance state to a first high resistance state due to application of a first resistance-increasing electrical pulse to a series circuit including the selected memory cell and the variable load resistor having a first resistance value, and reversibly changes from the first high resistance state to the first low resistance state due to application of a first resistance-decreasing electrical pulse to the series circuit, and the nonvolatile memory device further includes a control circuit that: detects, from among the memory cells, an excessively low resistance cell including a variable resistance element in a second low resistance state having a resistance value smaller than a resistance value of the first low resistance state; changes a resistance value of the variable load resistor from the first resistance value to a second resistance value smaller than the first resistance value; and causes the variable resistance element included in the excessively low resistance cell to shift to a second high resistance state having a resistance value greater than the resistance value of the first low resistance state, by applying a second resistance-increasing electrical pulse to a series circuit including the excessively low resistance cell and the variable load resistor having the second resistance value.

According to this configuration, the nonvolatile memory device according to the aspect of the present invention detects a memory cell in which a defect has occurred due to a diode being substantially short-circuited (excessively low resistance cell). Furthermore, the nonvolatile memory device decreases the resistance value of the variable load resistor, and then applies a voltage pulse to the detected excessively low resistance cell, thereby increasing the resistance of that memory cell. Accordingly, most of the voltage applied to the excessively low resistance cell to increase the resistance is applied to the variable resistance element, rather than to the variable load resistor, and thus the resistance of the variable resistance element can be increased. Therefore, the excessively low resistance cell can be brought out of the excessively low resistance state, and thus it is possible to prevent an excessive current from flowing into the defective memory cell when a current is caused to flow through the same row or column as that having the memory cell that has become defective. Accordingly, other memory cells are allowed to normally operate.

As described above, the nonvolatile memory device according to the aspect of the present invention can effectively prevent, even when a defect has occurred in a nonvolatile memory element, a state in which writing to or reading from other nonvolatile memory elements in the same row or column as that having the defective nonvolatile memory element cannot be performed.

Further, the nonvolatile memory device may further include: a recording unit configured to record an address of the excessively low resistance cell caused to shift to the second high resistance state; and at least one spare memory cell, wherein the control circuit may have a function of recording the address of the excessively low resistance cell caused to shift to the second high resistance state, and performing control such that an address of the spare memory cell is to be accessed when the address of the excessively low resistance cell is designated at a memory operation performed after the recording.

Further, the resistance value of the second high resistance state may be greater than the resistance value of the first high resistance state.

According to this configuration, the nonvolatile memory device according to the aspect of the present invention can further prevent a state in which writing to or reading from other nonvolatile memory elements in the same row or column as that having the defective nonvolatile memory element cannot be performed.

Further, the control circuit may control the variable load resistor so as to change the resistance value of the variable load resistor back to the first resistance value, after causing the excessively low resistance cell to shift to the second high resistance state.

According to this configuration, the nonvolatile memory device according to the aspect of the present invention can perform normal writing and reading operations in subsequent processing.

It should be noted that the present invention can be realized not only as a method for programming such a nonvolatile memory device, but also as a nonvolatile memory device that uses characteristic steps included in the programming method as means. Further, the present invention can be realized as a program that causes a computer to execute the characteristic steps included in the programming method. Also, it goes without saying that such a program can be distributed via a recording medium such as CD-ROM and a transmission medium such as the Internet.

Furthermore, the present invention can be realized as a semiconductor integrated circuit (LSI) that realizes a part or all of functions of such a nonvolatile memory device.

Advantageous Effects of Invention

As described above, the present invention can provide a nonvolatile memory device and a method for programming the same that enable, even when a defect has occurred in a nonvolatile memory device of 1D1R memory cells in each of which one variable resistance nonvolatile memory element and one diode are connected in series, effective prevention of a state in which writing to or reading from other nonvolatile memory elements in the same row or column as that having the defective nonvolatile memory element cannot be performed.

DESCRIPTION OF EMBODIMENTS

The following is a detailed description of embodiments of the present invention with reference to the drawings. It should be noted that the same numerals are given to the same or corresponding elements through all the drawings, and a description thereof may be omitted.

Further, the embodiments described below each show a preferred specific example of the present invention. Numerical values, shapes, material, constituent elements, arrangement positions and connection configurations of the constituent elements, steps, the order of the steps, and the like described in the following embodiments are examples, and are not intended to limit the present invention. The present invention is limited only by the claims. Therefore, although a constituent element, among the constituent elements in the embodiments below, which shows the broadest concept of the present invention and is not described in independent claims is not necessarily needed in order to achieve the object of the present invention, such a constituent element will be described as an element that constitutes a more preferred configuration.

Embodiment 1

[Schematic Configuration]

Figure 1A:
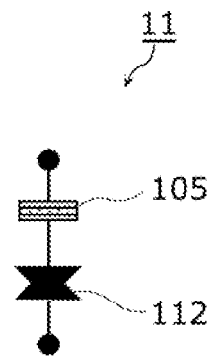
FIG. 1A is a schematic diagram of a memory cell according to Embodiment 1 of the present invention.

FIG. 1A is a schematic circuit diagram showing a memory cell 11 according to Embodiment 1 of the present invention.

Figure 1B:
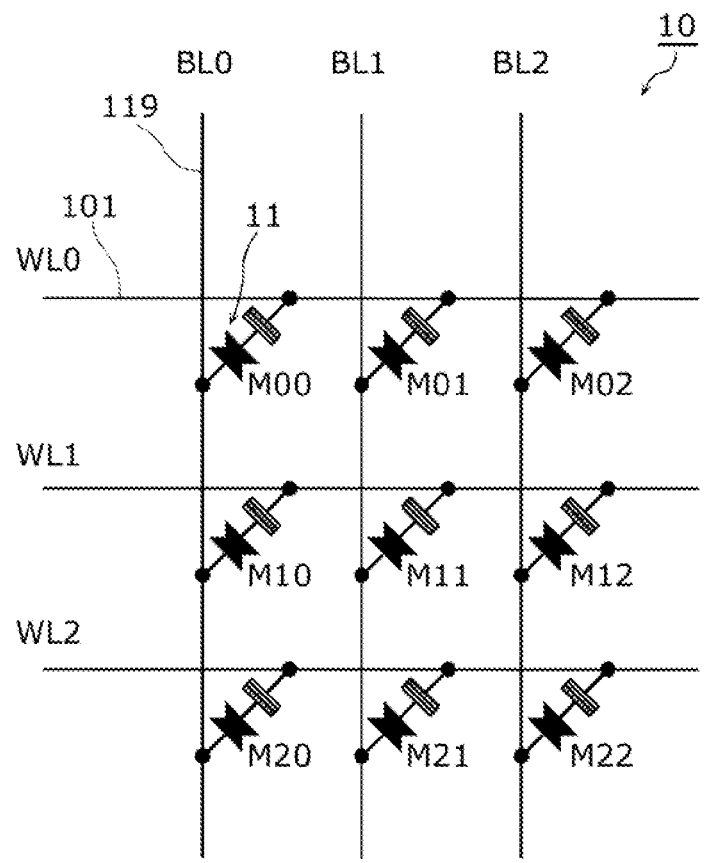
FIG. 1B is a schematic diagram of a semiconductor memory device according to Embodiment 1 of the present invention.

FIG. 1B is a schematic circuit diagram showing a semiconductor memory device (memory cell array) 10 according to Embodiment 1 of the present invention.

Figure 2:
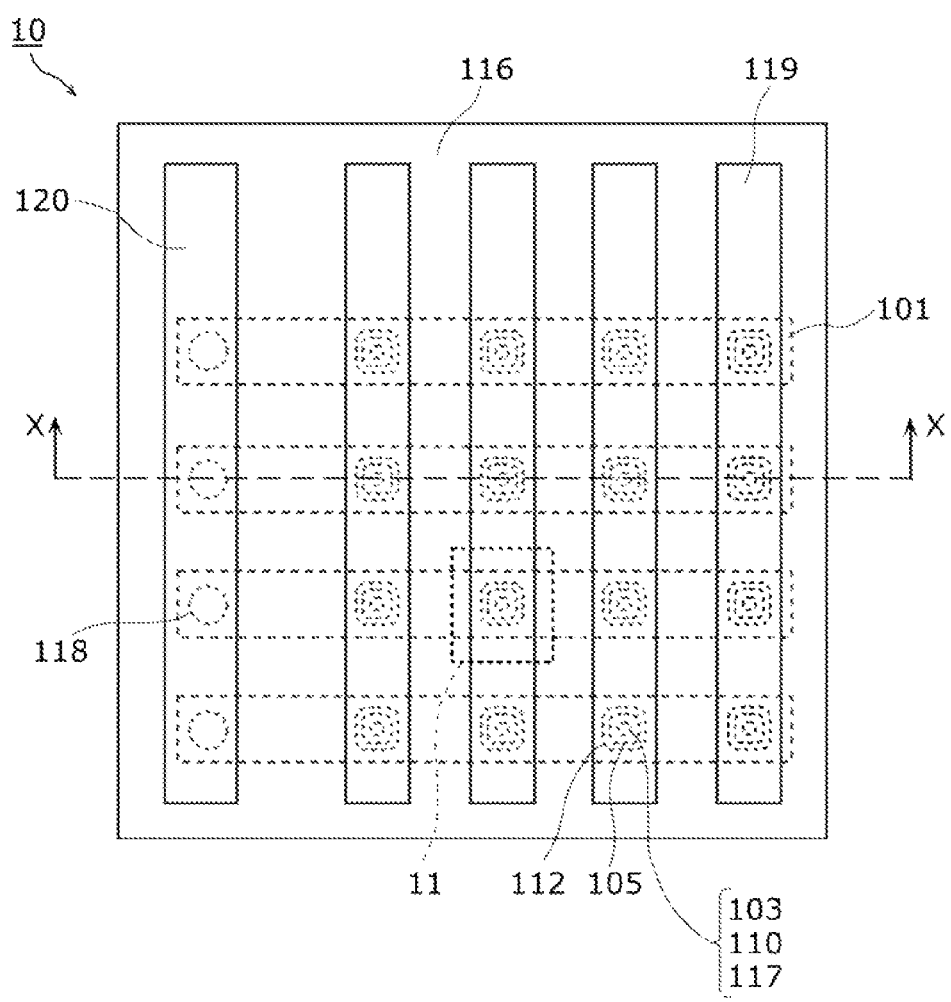
FIG. 2 is a top view of the semiconductor memory device according to Embodiment 1 of the present invention.

FIG. 2 is a schematic plan view two-dimensionally showing the configuration of the semiconductor memory device 10 shown in FIG. 1B.

Figure 3:
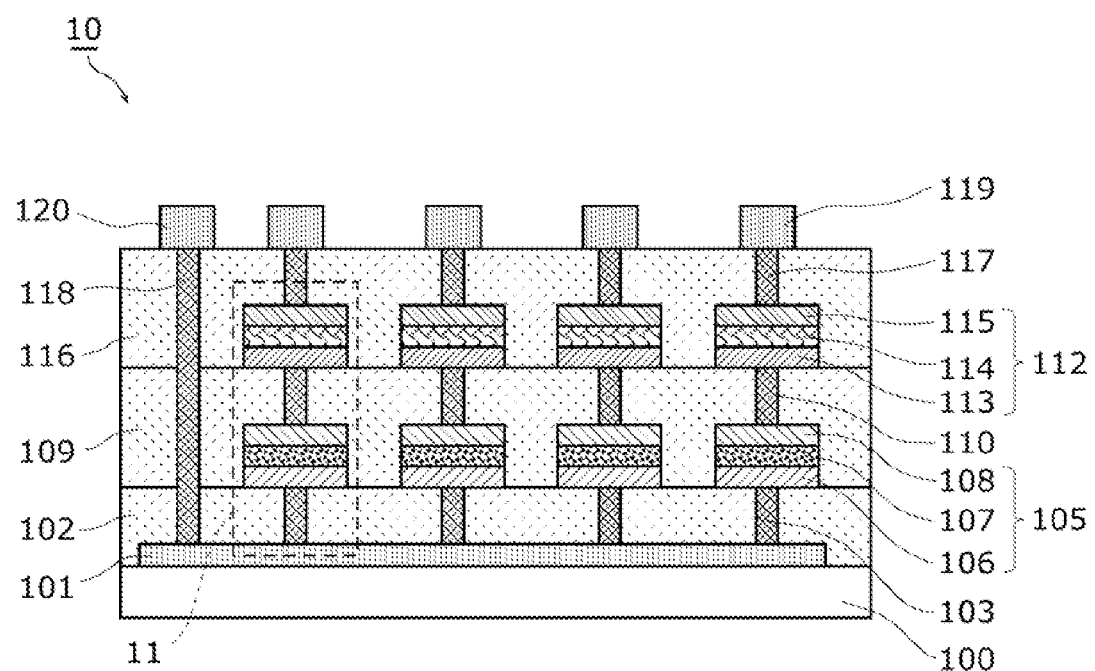
FIG. 3 is a cross-sectional view of the semiconductor memory device according to Embodiment 1 of the present invention.

FIG. 3 is a schematic cross sectional view taken along plane X-X shown in FIG. 2.

As shown in FIG. 1A, the memory cell 11 according to Embodiment 1 of the present invention has a configuration in which a diode 112 and a variable resistance element 105 are connected in series.

As shown in FIG. 1B, the semiconductor memory device according to Embodiment 1 of the present invention includes a plurality of memory cells 11 arranged in a matrix. One end of each of the memory cells 11 is connected to a first line (word line) 101, and the other end thereof is connected to a second line (bit line) 119. In this manner, the semiconductor memory device 10 has a crosspoint structure.

For example, when a memory cell M11 shown in FIG. 1B shifts to the excessively low resistance state and becomes defective, a word line WL1 and a bit line BL1 will be short-circuited due to the memory cell 11, thereby preventing normal writing to and reading from other memory cells (M10, M12) in the same row and other memory cells (M01, M21) in the same column.

As shown in FIGS. 2 and 3, the semiconductor memory device 10 according to the present embodiment includes: a substrate 100; a plurality of first lines (word lines) 101 that are disposed, on the main surface of the substrate 100, parallel to each other to extend in a first direction (lateral direction in FIGS. 2 and 3); a plurality of second lines (bit lines) 119 disposed parallel to each other above the first lines 101 and on a plane parallel to the main surface of the substrate 100, the second lines 119 extending in a second direction the direction perpendicular to the paper surface in FIG. 3, and the vertical direction in FIG. 1B) so as to three-dimensionally intersect with the first lines 101; and a nonvolatile memory element array having a plurality of memory cells (nonvolatile memory elements) 11 that are provided such that the memory cells 11 respectively correspond to three-dimensional crosspoints of the first lines 101 and the second lines 119, and connect the first lines 101 and the second lines 119.

The variable resistance elements 105 each include a lower electrode (first electrode) 106, an upper electrode (second electrode) 108, and a variable resistance layer 107 interposed between the lower electrode 106 and the upper electrode 108. The lower electrode 106 and the variable resistance layer 107 are physically in contact with each other, and the upper electrode 108 and the variable resistance layer 107 are physically in contact with each other.

The diodes 112 each include a lower electrode (third electrode) 113, an upper electrode (fourth electrode) 115, and an insulating or semiconductor layer 114 interposed between the lower electrode 113 and the upper electrode 115. The lower electrode 113 and the insulating or semiconductor layer 114 are physically and electrically in contact with each other so as to form a Schottky barrier junction, and the upper electrode 115 and the insulating or semiconductor layer 114 are physically and electrically in contact with each other so as to form a Schottky barrier junction.

A first interlayer insulating layer 102 is formed over the substrate 100 to cover the first line 101. The variable resistance elements 105 are formed on the first interlayer insulating layer 102 to be arranged at equal intervals above the first lines 101, when viewed from the main surface side of the substrate 100 (downward from the top of FIG. 3).

The first lines 101 and the lower electrodes 106 of the variable resistance elements 105 above the first lines 101 are connected by first contact plugs 103 formed to penetrate through the first interlayer insulating layer 102.

A second interlayer insulating layer 109 is formed over the first interlayer insulating layer 102 to cover the variable resistance elements 105. The diodes 112 are formed on the second interlayer insulating layer 109 at positions where the diodes 112 overlap the variable resistance elements 105 when viewed from the main surface side of the substrate 100. The upper electrodes 108 of the variable resistance elements 105 and the lower electrodes 113 of the diodes 112 are connected by second contact plugs 110 without being directly in contact with either the variable resistance layers 107 of the variable resistance elements 105 or the semiconductor layers 114 of the diodes 112.

A third interlayer insulating layer 116 is formed over the second interlayer insulating layer 109 to cover the diodes 112. The second lines 119 are formed, on the third interlayer insulating layer 116, to be orthogonal to the first lines 101 and overlap the variable resistance elements 105 and the diodes 112, when viewed from the main surface side of the substrate 100. The second lines 119 and the upper electrodes 115 of the diodes 112 below the second lines 119 are connected by third contact plugs 117 formed to penetrate through the third interlayer insulating layer 116.

As described above, the memory cells 11 each include: the first contact plug 103 that is provided between the first line 101 and the lower electrode 106 of the variable resistance element 105, and establishes electrical continuity therebetween; the second contact plug 110 that is provided between the upper electrode 108 of the variable resistance element 105 and the lower electrode 113 of the diode 112, and establishes electrical continuity therebetween; and the third contact plug 117 that is provided between the upper electrode 115 of the diode 112 and the second line 119, and establishes electrical continuity therebetween.

Further, on the third interlayer insulating layer 116, a lead line 120 that extends in the second direction and parallel to the second lines 119 is formed in a region outside the region where the memory cells 11 are arranged when viewed in the thickness direction. The first lines 101 and the lead line 120 are connected by fourth contact plugs 118 that are formed to penetrate through the first interlayer insulating layer 102, the second interlayer insulating layer 109; and the third interlayer insulating layer 116.

The first lines 101, the second lines 119, and the lead line 120 comprise conductive material such as aluminum or copper, for example. The first interlayer insulating layer 102, the second interlayer insulating layer 109, and the third interlayer insulating layer 116 comprise insulating material such as silicon oxide, for example.

The contact plugs except the first contact plugs 103, namely, the second contact plugs 110, the third contact plugs 117, and the fourth contact plugs 118 comprise conductive material such as tungsten or copper, for example.

Such a configuration realizes the semiconductor memory device 10 including the crosspoint memory cell array, the memory cell array including the memory cells 11 respectively provided at three-dimensional crosspoints of the first lines 101 and the second lines 119 that intersect with each other, when the semiconductor memory device 10 is viewed from the main surface side of the substrate 100.

[Configuration of Variable Resistance Element]

The variable resistance layers 107 of the variable resistance elements 105 according to the present embodiment comprise an oxygen-deficient transition metal oxide. Here, an oxygen-deficient transition metal oxide is a transition metal oxide having less oxygen content [atom ratio: proportion of oxygen atoms to total atoms], compared with a stoichiometric oxide. For example, in the case where transition metal is tantalum (Ta), the composition of a stoichiometric oxide is $Ta_2O_5$, where the ratio of O to Ta (O/Ta) in the number of atoms is 2.5. Therefore, the atomic ratio of O to Ta of the oxygen-deficient tantalum oxide is greater than zero and smaller than 2.5.

Although the variable resistance layers 107 can comprise an oxygen-deficient tantalum oxide ($TaO_x$: $0<x<2.5$) or an oxygen-deficient hafnium oxide ($HfO_x$: $0<x<2.0$), other transition metal oxides such as an oxygen-deficient zirconium oxide may be used, rather than using the tantalum oxygen-deficient oxide or the hafnium oxygen-deficient oxide. Further, the variable resistance layers comprising an oxygen-deficient transition metal oxide may have a stack structure comprising transition metal oxides having different oxygen content. For example, a variable resistance layer having high oxygen content (high resistance layer) is disposed on the upper electrode side, and a variable resistance layer having low oxygen content (low resistive layer) is disposed on the lower electrode side. In this case, when a positive voltage pulse that is equal to or greater than a first threshold value is applied to the upper electrode with reference to the lower electrode, the resistance of the variable resistance layer is increased, whereas when a negative voltage pulse whose absolute value is a second threshold value or greater is applied, the resistance of the variable resistance layer is decreased. A current may be limited at a predetermined current value, in the case of decreasing the resistance of the variable resistance layer. As a method for current limiting, a transistor or load resistor may be connected in series to a variable resistance element. These variable resistance layers exhibit a property of reversibly switching resistance values in a stable manner.

In the present embodiment, the resistance value of each of the variable resistance elements 105 is switched using electrical pulses of different polarities. When the resistance is to be increased (when a reset operation is performed), a positive voltage (positive-polarity electrical signal) is applied to the upper electrode 108 side with reference to the lower electrode 106, and a current flows from the upper electrode 108 to the lower electrode 106. Accordingly, on the upper electrode side, an electron is taken away from the variable resistance layer 107 to the electrode, thereby oxidizing the material of the variable resistance layer 107, and the resistance value thereof increases.

When the resistance is to be decreased (when a set operation is performed), a negative voltage (negative-polarity electrical signal) is applied to the upper electrode 108 side with reference to the lower electrode 106, and a current flows from the lower electrode 106 to the upper electrode 108. Accordingly, on the upper electrode side, an electron is given from the electrode to the variable resistance layer 107, thereby deoxidizing the material of the variable resistance layer 107, and the resistance value thereof decreases.

A material such as, for example, platinum (Pt) or iridium (Ir) is used for the upper electrode 108, the material having a standard electrode potential higher than that of a metal comprising the variable resistance layer, whereas a material such as, for example, tantalum nitride (TaN) is used for the lower electrode 106, the material having a standard electrode potential lower than that of the material of the upper electrode. Accordingly, a resistance change phenomenon can be selectively caused in the variable resistance layer near the upper electrode.

The thickness of the variable resistance layer 107 can be 50 to 200 nm, for example. When the layer is a variable resistance layer having a stack structure, the thickness of a high resistance layer can be 1 to 10 nm. By using a layer having a thickness as described above, the resistance can be stably changed using a low voltage equal to or lower than 5 V.

[Configuration of Diode]

In the present embodiment, as described above, electrical pulses of different polarities are applied between the two electrodes of the variable resistance elements 105, thereby switching the resistance value of the variable resistance elements 105, the electrical pulses each having an absolute value equal to or greater than a certain threshold value. Therefore, a current needs to flow in both directions between the two electrodes in the memory cells 11. Thus, the bidirectional diodes 112 are adopted which have a function of causing, when a memory cell is selected, a current to bidirectionally flow into the corresponding variable resistance element 105, and preventing, when a memory cell is not selected, a current from flowing into the corresponding variable resistance element 105. The diodes 112 are elements with a nonlinear current-voltage characteristic, and have a large resistance value (OFF state) when the absolute value of the applied voltage is smaller than that of a critical voltage, whereas the diodes 112 have an extremely small resistance value (ON state) when the absolute value of the applied voltage is equal to or greater than the absolute value of a positive or negative critical voltage.

The diodes 112 in the present embodiment are each constituted as an MSM diode that includes, for example, the lower electrode 113 comprising a tantalum nitride, the semiconductor layer 114 comprising a nitrogen-deficient silicon nitride film whose nitrogen content is lower than that of $Si_3N_4$, and the upper electrode 115 comprising a tantalum nitride. The thickness of the semiconductor layer 114 can be 3 to 20 nm. The silicon nitride film can be formed to have a semiconductor characteristic by lowering the nitrogen content, and the diodes 112 constituted as MSM diodes can be produced according to simple manufacturing processing. A nitrogen-deficient silicon nitride film ($SiN_z$: 0<z<1.33) can be formed by reactive sputtering in a nitrogen gas atmosphere using a Si target, for example. At this time, the film may be produced under a room temperature condition, with the pressure of a chamber being 0.1 Pa to 1 Pa, and the $Ar/N_2$ flow rate being 18 sccm/2 sccm.

Figure 4:
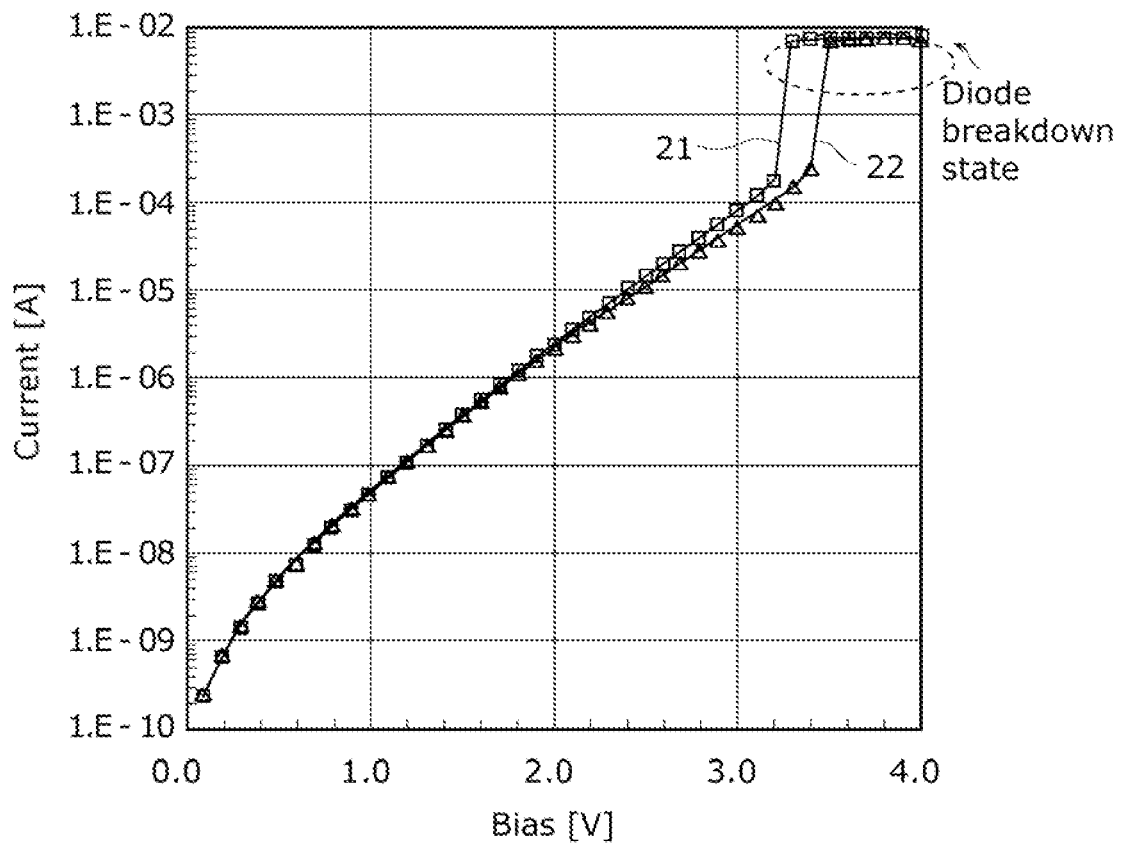
FIG. 4 is a graph showing current-voltage characteristics of a diode according to Embodiment 1 of the present invention.

FIG. 4 shows IV curves (current-voltage characteristics) on the positive side of the bidirectional diodes 112 produced according to the above method (curves on the negative side are the same except for the sign being opposite).

In fact, a variation between the IV curves of the diodes 112 is also caused due to, for instance, a processing variation that caused during manufacturing. IV curves 21 and 22 shown in FIG. 4 show examples of such a variation.

Further, as shown in FIG. 4, if a voltage applied to both ends of the diodes 112 is increased, a current also increases, which will bring the diodes 112 into a dielectric breakdown state.

The maximum voltage (the maximum voltage that can be applied to the diodes 112) and the maximum current (the maximum current that can flow into the diodes 112) before dielectric breakdown occurs are 3.2 V and 180 μA on the IV curve 21, and 3.4 V and 250 μA on the IV curve 22.

It should be noted that although an example in which the diodes 112 are metal-semiconductor-metal (MSM) diodes is described here, the diodes 112 may be metal-insulator-metal (MIM) diodes that each include an insulating layer between the lower electrode 113 and the upper electrode 115. In that case, $SiO_2$, $Si_3O_4$, $Ta_2O_5$, or the like can be used as the material of the insulating layer. It should be noted that MSM diodes are more advantageous when a larger current is to be caused to flow in the ON state.

[Operation of Memory Cell in Normal State]

The following is a description of features when the variable resistance element 105 using a tantalum oxygen-deficient oxide (thickness: about 30 nm) as the variable resistance layer 107 and the diode 112 using a nitrogen-deficient silicon nitride as the semiconductor layer 114 are connected in series.

Figure 5A:
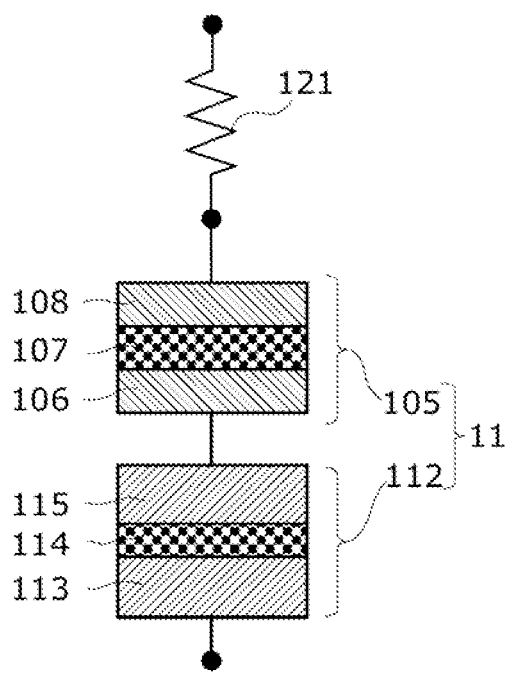
FIG. 5A is a schematic diagram showing a connection relationship between the memory cell and a load resistor according to Embodiment 1 of the present invention.

FIG. 5A is a schematic diagram of the memory cell 11 according to the present embodiment.

Figure 5B:
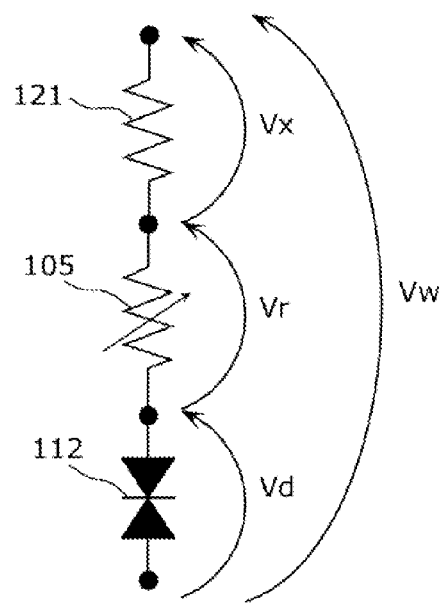
FIG. 5B is an equivalent circuit diagram showing the connection relationship between the memory cell and the load resistor according to Embodiment 1 of the present invention.

FIG. 5B is an equivalent circuit diagram of the memory cell 11 according to the present embodiment.

Figure 6:
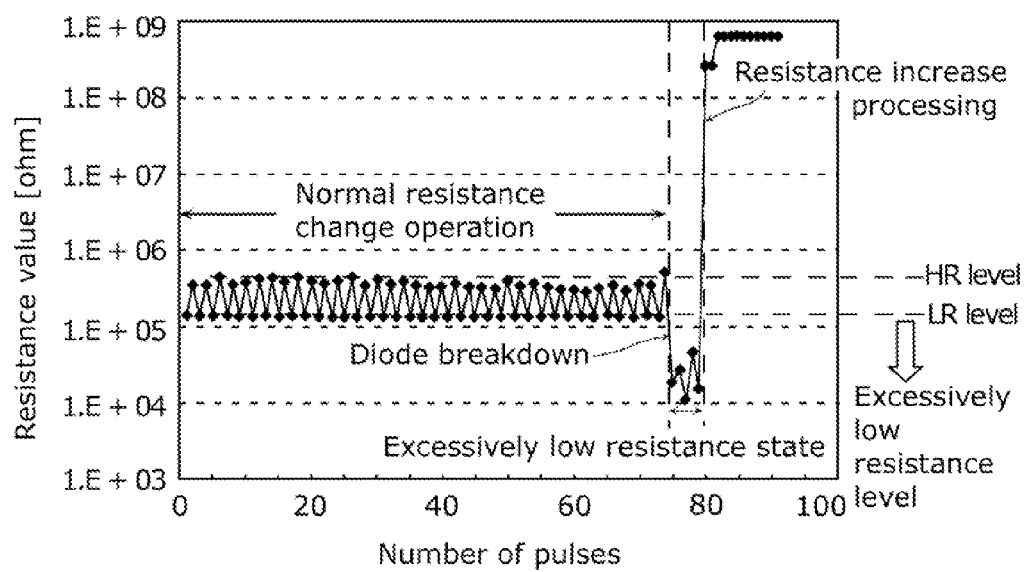
FIG. 6 is a graph showing a resistance change state according to Embodiment 1 of the present invention.

FIG. 6 is a graph showing a change in the resistance value when a voltage pulse is applied to the above memory cell.

As shown in FIG. 5A, the memory cell 11 is constituted by connecting the diode 112 and the variable resistance element 105 in series. Furthermore, in order to stabilize a resistance change operation, a load resistor 121 is connected to the memory cell 11 in series.

The variable resistance element 105 reversibly changes, due to the application of an electrical pulse to the series circuit including the memory cell 11 and the load resistor 121, between a first low resistance state (LR state) and a first high resistance state (HR state) having a resistance value greater than that of the first low resistance state.

It should be noted that in the following, the memory cell 11 including the variable resistance element 105 in the LR state is referred to as the memory cell 11 in the LR state, whereas the memory cell 11 including the variable resistance element 105 in the HR state is referred to as the memory cell 11 in the HR state.

The load resistor 121 is polysilicon resistance, impurity diffused layer resistance, or ON resistance of a transistor, for example. It should be noted that other than this, the load resistor 121 may be realized using various methods as described in Patent Literature 2.

FIG. 5B shows an equivalent circuit diagram of a configuration shown in FIG. 5A.

When a rewriting operation is performed (at the time of first increase in the resistance and first decrease in the resistance), a voltage Vw (polarity and absolute value are different at the time of the first increase in the resistance and at the time of the first decrease in the resistance) is applied to both ends of the series circuit including the memory cell 11 and the load resistor 121.

The rewriting voltage Vw is divided into voltages respectively corresponding to the resistance values of the diode 112, the variable resistance element 105, and the load resistor 121, and thus Vw=Vd+Vr+Vx. Here, Vd represents the voltage at both ends of the diode 112, Vr represents the voltage at both ends of the variable resistance element 105, and Vx represents the voltage at both ends of the load resistor 121.

For example, if the current that flows when the resistance of the variable resistance element 105 is changed (e.g., when the resistance is decreased) is 100 μA, Vd is about 3 V, as is shown by the IV curve 21 of the diode 112 shown in FIG. 4.

Therefore, when Vw=6.5 V, Vw−Vd=Vr+Vx=3.5 V. Further, when the resistance value of the load resistor 121 is 5000Ω, Vx=0.5 V, and Vr=3.0 V.

Assume that dielectric breakdown occurs in the diode 112 of a memory cell 11 during application of a voltage pulse in this state. In this case, the voltage applied to the diode 112 is extremely decreased, and thus Vw=Vr+Vx (Vd≈0 V).

Accordingly, the rewriting voltage Vw is divided into voltages corresponding to the variable resistance element 105 and the load resistor 121.

In this case, since the resistance value of the load resistor 121 is 5000Ω, when the resistance value of the variable resistance element 105 in the low resistance state (LR state) is 5000Ω, Vr=Vx=6.5/2=3.25 V.

Furthermore, when the resistance value of the load resistor 121>the resistance value for the LR state, the voltage Vr effectually applied to the variable resistance element 105 will be further decreased.

The following is a description using the pulse resistance change graph shown in FIG. 6.

In the example "normal resistance change operation" shown in FIG. 6, a voltage pulse having a voltage value of +6.5 V and a pulse width of 500 ns as a first resistance-increasing voltage pulse and a voltage pulse having a voltage value of −5.5 V and a pulse width of 500 ns as a first resistance-decreasing voltage pulse are alternately applied between the lower electrode 106 and the upper electrode 115, specifically, to the upper electrode 115 with reference to the lower electrode 106.

Further, the resistance value indicated by the vertical axis of FIG. 6 is a sum of the resistance values of the load resistor 121 and the memory cell 11 including the variable resistance element 105 and the diode 112. As shown in FIG. 6, if the first resistance-increasing voltage pulse (e.g., voltage value is +6.5 V) is applied, the resistance value will be in the first high resistance state (e.g., about 500 kΩ). On the contrary, if the first resistance-decreasing voltage pulse (e.g., voltage value is −5.5 V) is applied, the resistance value will be in the first low resistance state (e.g., about 100 kΩ). When the first resistance-decreasing voltage pulse is applied, a first operating current (e.g., about ±100 to 200 μA) flows into the variable resistance element 105. It should be noted that a first read voltage (e.g., 3.5 V) is used to read these resistance values, and the resistance value of the load resistor 121 is 5000 Ω.

[Diode Breakdown—Excessively Low Resistance—Resistance Increase Processing Operation]

At the "diode breakdown" point and thereafter shown in FIG. 6, the diode 112 of the memory cell 11 is short-circuited due to dielectric breakdown.

As a result, the resistance change range shifts downward, and the variable resistance element 105 shifts to the excessively low resistance state (the second low resistance state) having a resistance value smaller than that of the first low resistance state (LR level).

In this state, even if the first resistance-increasing voltage pulse and the first resistance-decreasing voltage pulse are continuously applied, it can be seen that the resistance value of the memory cell 11 maintains the excessively low resistance state having the resistance value smaller than that at the LR level.

Next, the second resistance-increasing voltage is applied to the memory cell 11 in order to increase the resistance of the memory cell 11 in the excessively low resistance state. At this time, in order to increase the voltage effectually applied to the variable resistance element 105, the load resistor 121 is switched to the load resistor having a resistance value smaller than that during the normal operation. In the example of FIG. 6, the resistance value of the load resistor 121 is changed from 5000Ω to 0Ω, and the second resistance-increasing voltage (e.g., +10 V) is applied. As a result, the memory cell 11 is brought out of the second low resistance state, and the resistance thereof is increased up to a second high resistance state (here, 100 MΩ or higher).

Further, it has been found that even if the first resistance-increasing voltage pulse and the first resistance-decreasing voltage pulse are applied again to the memory cell 11 after the resistance thereof has been increased to the second high resistance state, the resistance of the memory cell 11 is not decreased.

It should be noted that in the example of FIG. 6, although the resistance value of the load resistor 121 is changed to 0Ω at the time of the second resistance-increasing processing, the resistance value of the load resistor 121 need only be adjusted so as to obtain an effective voltage sufficient for resistance-increasing processing, and thus the value does not need to be 0Ω. Accordingly, during the resistance-increasing processing, the resistance value of the load resistor 121 need only be a resistance value smaller than that during the normal operation. Further, in the above description, although +10 V is applied as a resistance-increasing voltage, the value may be a voltage value other that that.

In fact, a load resistance of about hundreds to 1000Ω is often included, such as wiring resistance and contact resistance from a voltage pulse generation circuit up to the memory cell 11.

Further, in the example of FIG. 6, although resistance-increasing processing is performed to cause the resistance to reach the extremely high level, if the resistance is increased up to a level higher than at least the LR level at the time of normal operation, the operation of other memory cells included in the same row or the same column as that having a defective memory cell is not blocked.

In the above manner, the resistance of the excessively low resistance defective memory cell generated due to diode breakdown can be increased. Accordingly, the current that flows into the defective memory cell decreases, and thus the operation of other memory cells included in the same row or the same column as that having the defective memory cell is not blocked.

The address of the defective memory cell that has been caused to shift to the second high resistance state as described above is recorded separately, and in the memory operation performed after the recording, a peripheral circuit of a memory device performs control such that the address of that defective memory cell is not selected. Embodiment 2 below will describe this example.

Embodiment 2

Next, Embodiment 2 describes a nonvolatile memory device having the semiconductor memory device (memory cell array) 10 described in Embodiment 1.

Figure 7:
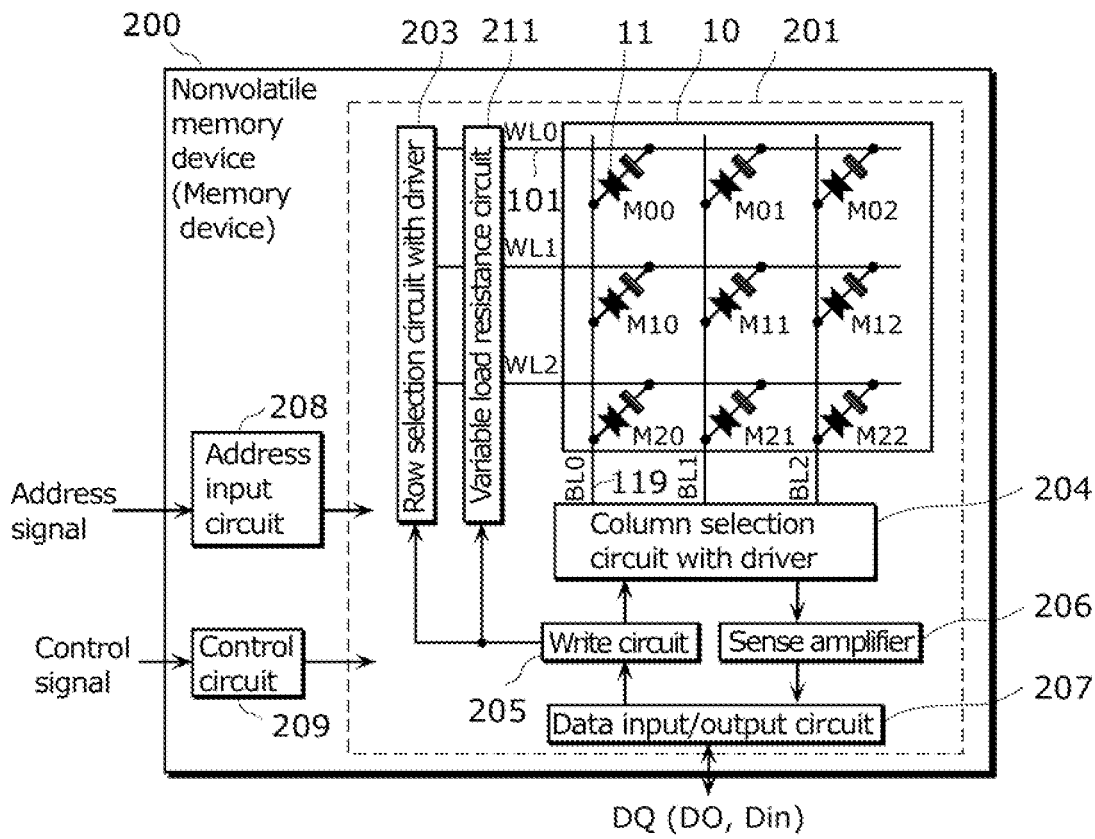
FIG. 7 is a block diagram of a nonvolatile memory device according to Embodiment 2 of the present invention.

FIG. 7 shows a schematic configuration of a nonvolatile memory device (hereinafter, also simply referred to as "memory device") 200 including the memory cells 11.

Figure 8A:
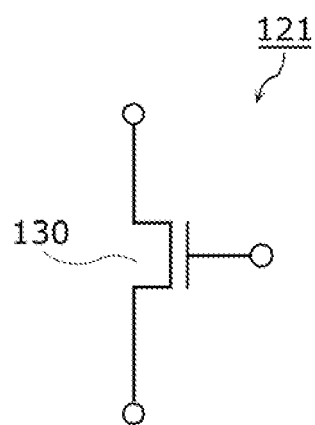
FIG. 8A shows an example of a load resistor according to Embodiment 2 of the present invention.
Figure 8B:
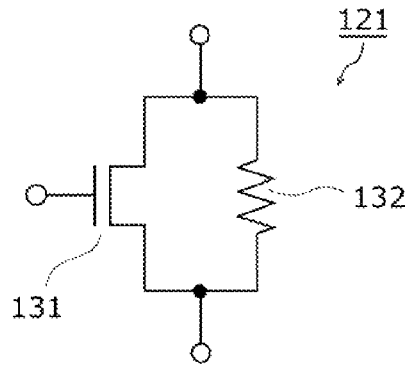
FIG. 8B shows an example of the load resistor as according to Embodiment 2 of the present invention.

FIGS. 8A and 8B each show an example of the load resistor 121.

Figure 9:
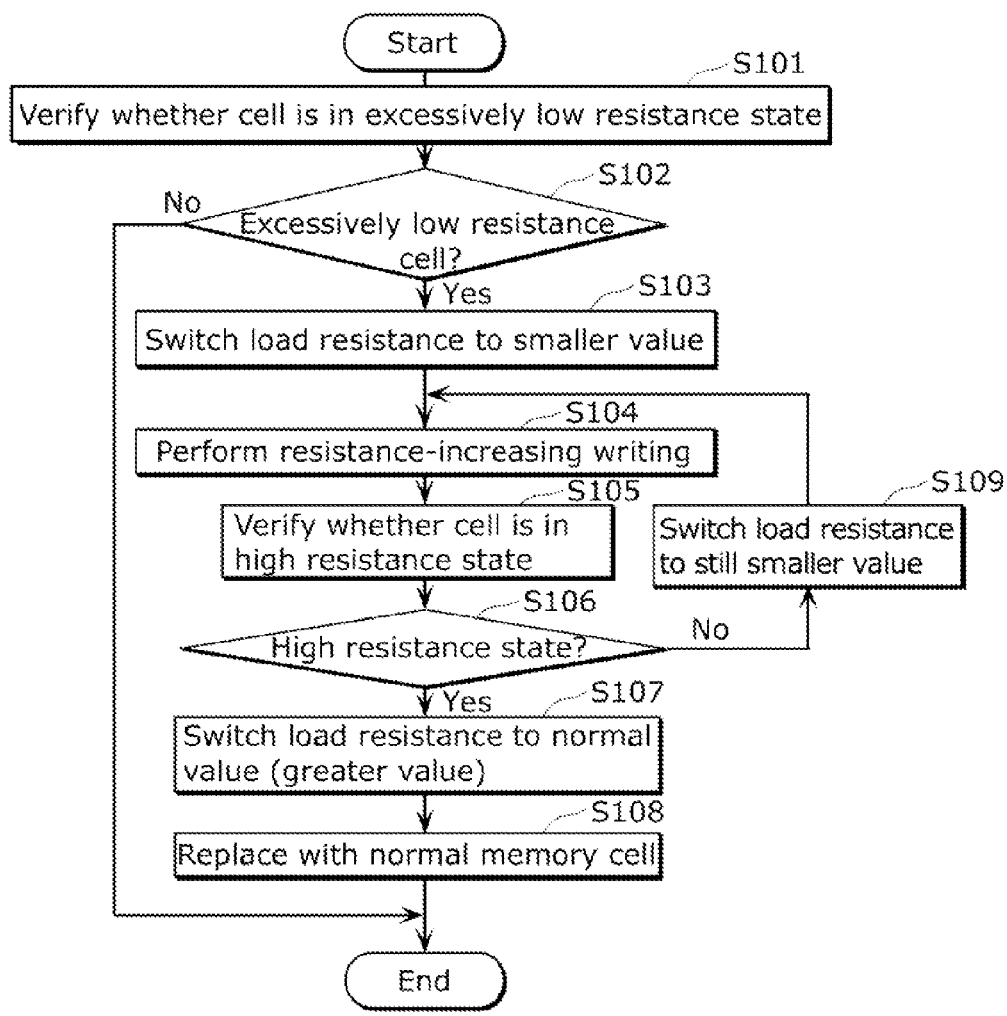
FIG. 9 is a flowchart of a programming method performed by the nonvolatile memory device according to Embodiment 2 of the present invention.
Figure 10:
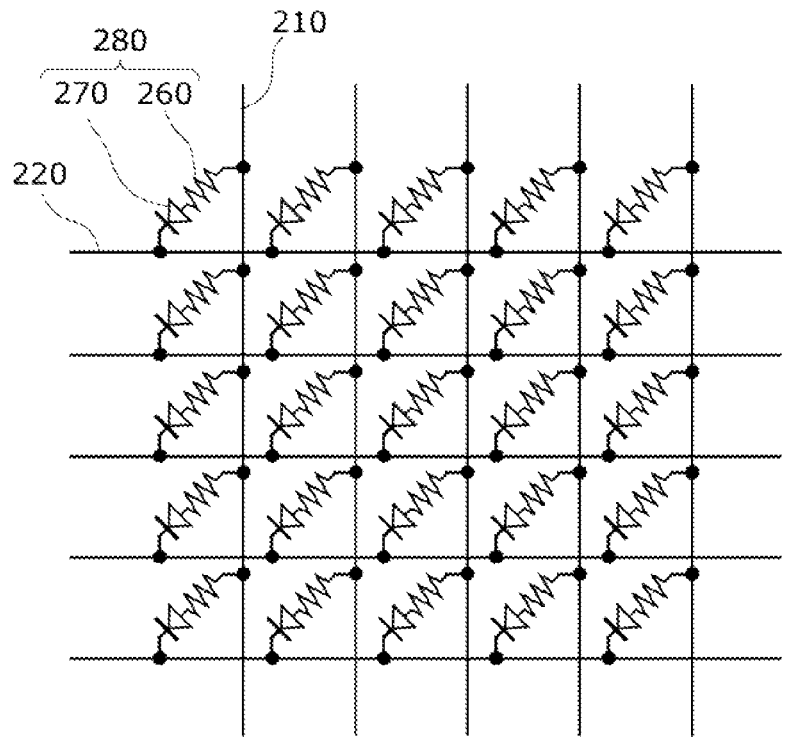
FIG. 10 shows a semiconductor memory device that includes a conventional variable resistance element.
Figure 11:
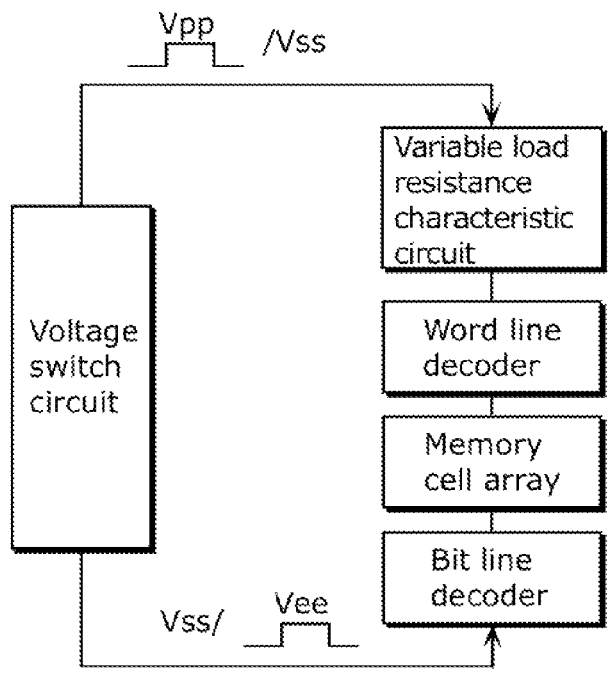
FIG. 11 is a block diagram showing a relationship among the conventional variable resistance element, a load circuit, and a peripheral circuit.

FIG. 9 is a flowchart of writing processing for increasing the resistance of a defective bit in the excessively low resistance state.

The memory device 200 shown in FIG. 7 is a crosspoint memory device including the memory cells 11 at points where the word lines 101 and the bit lines 119 three-dimensionally intersect with each other. Further, the memory device 200 includes the memory cell array 10 in which the memory cells 11 (e.g., 256 memory cells) having the structure described in Embodiment 1 are arranged.

The memory device 200 includes a memory body 201. This memory body 201 includes the memory cell array 10, a row selection circuit 203 with a driver, a column selection circuit 204 with a driver, a write circuit 205 for writing information, a sense amplifier 206 that amplifies the potential of the bit lines 119, a data input/output circuit 207 that inputs and outputs input/output data via a terminal DQ, and a variable load resistance circuit 211. Also, the memory device 200 further includes an address input circuit 208 that receives an address signal input from the outside, and a control circuit 209 that controls operation of the memory body 201 based on a control signal input from the outside.

The memory cell array 10 has the nonvolatile memory elements described in Embodiment 1 arranged in matrix as the memory cells 11. The memory cell array 10 includes the word lines 101 (WL0, WL1, WL2, . . . ) formed parallel to each other on the semiconductor substrate, and the bit lines 119 (BL0, BL1, BL2, . . . ) formed parallel to each other above the word lines 101 and on a plane parallel to the main surface of the semiconductor substrate, such that the bit lines 119 three-dimensionally intersect with the word lines 101.

Further, the memory cells 11 (M00, M01, M02, . . . , M10, M11 and M12, . . . , M20, M21 and M22, . . . ) are provided in matrix, corresponding to the points where the word lines 101 and the bit lines 119 three-dimensionally intersect with each other.

Here, the memory cells 11 correspond to the nonvolatile memory elements (the memory cells 11) according to Embodiment 1, and each have a structure in which the variable resistance element 105 that includes a variable resistance layer including an oxygen-deficient tantalum oxide is formed above the semiconductor substrate, and a bidirectional diode (here, the MSM diode 112) is connected to the variable resistance element 105 in series.

The address input circuit 208 receives address signals from an external circuit (not shown), and based on these address signals, outputs row address signals to the row selection circuit 203 with the driver, and also outputs column address signals to the column selection circuit 204 with the driver. Here, the address signals are signals that indicate the address of a specific memory cell 11 that is selected from among the memory cells 11. Further, the row address signals are signals that indicate the row address of the address indicated in the address signals, whereas the column address signals are signals that indicate the column address of the address indicated in the address signals.

The control circuit 209 outputs, to the write circuit 205, a write signal for instructing application of a write voltage, according to input data Din received by the data input/output circuit 207, in a write cycle of information. On the other hand, the control circuit 209 outputs, to the column selection circuit 204 with the driver, a read signal for instructing application of a read voltage in a read cycle of information.

The row selection circuit 203 with the driver receives the row address signals output from the address input circuit 208, selects one of the word lines 101 according to these row address signals, and applies a predetermined voltage to the selected word line 101.

Further, the column selection circuit 204 with the driver receives the column address signals output from the address input circuit 208, selects one of the bit lines 119 according to these column address signals, and applies a write voltage or a read voltage to the selected bit line 119. The row selection circuit 203 with the driver and the column selection circuit 204 with the driver constitute a selection circuit that selects at least one memory cell 11 from the memory cell array 10.

When receiving the write signal output from the control circuit 209, the write circuit 205 outputs, to the row selection circuit 203 with the driver, a signal for instructing the circuit to apply a voltage to the selected word line 101, and also outputs, to the column selection circuit 204 with the driver, a signal for instructing the circuit to apply a write voltage to the selected bit line 119.

Furthermore, when receiving the write signal output from the control circuit 209, the write circuit 205 outputs, to the variable load resistance circuit 211, a signal for instructing the circuit to connect the load resistor 121 having a first resistance value to the selected word line 101.

The variable load resistance circuit 211 includes the load resistor 121 whose resistance value can be changed, as illustrated in FIGS. 8A and 8B. The variable load resistance circuit 211 connects the load resistor 121 to the selected word line 101. Further, the variable load resistance circuit 211 may switch the resistance value of the load resistor 121 to values at a plurality of levels, namely, among the first resistance value, a second resistance value smaller than the first resistance value, and a third resistance value smaller than the second resistance value, for example.

For example, the load resistor 121 can be constituted using a transistor 130, as shown in FIG. 8A. In this case, the variable load resistance circuit 211 changes on-resistance of the transistor 130 by changing the gate voltage of the transistor 130. In this manner, the variable load resistance circuit 211 changes the resistance value of the load resistor 121.

Further, as shown in FIG. 8B, the load resistor 121 may be constituted to include a transistor 131 and a resistor 132 that are connected in parallel. In this case, the variable load resistance circuit 211 changes the resistance value of the load resistor 121 by switching ON and OFF of the transistor 131.

Further, the sense amplifier 206 amplifies the potential of the bit line 119 that is a read target in the read cycle of information. Output data DO obtained as a result is output to the external circuit via the data input/output circuit 207. Specifically, the sense amplifier 206 determines whether the variable resistance element 105 included in the memory cell 11 selected by the selection circuit (the row selection circuit 203 with the driver and the column selection circuit 204 with the driver) is in the high resistance state or the low resistance state.

Therefore, in the memory cell 11 in which the MSM diode 112 and the variable resistance element 105 are connected in series, the MSM diode 112 will be in the ON state in which a high application voltage is applied, during writing. Accordingly, a high voltage is efficiently applied to the variable resistance element 105, and thus writing to the memory cell 11 can be stably performed.

Further, during reading, an application voltage lower than the application voltage for writing is applied to the MSM diode 112. Accordingly, only a comparatively low voltage is applied to the variable resistance element 105, which can efficiently prevent the occurrence of write disturb. Further, the MSM diode 112 can efficiently prevent the influence of noise and cross talk on the variable resistance element 105, and thus the occurrence of malfunction of the memory cell 11 can be prevented.

As described above, the memory device 200 according to the present embodiment is constituted using the memory cells 11 described in Embodiment 1 of the present invention.

The memory device 200 according to the present embodiment may further include an excessively low resistance cell address recording unit that records the address of an excessively low resistance cell caused to shift to a second high resistance state, and at least one spare memory cell (not shown), and the control circuit 209 may have a function of recording the address of the excessively low resistance cell caused to shift to the second high resistance state in the excessively low resistance cell address recording unit, and performing control such that the address of the spare memory cell is to be accessed when the address of the excessively low resistance cell is designated when a memory operation is performed after the recording.

The following is a description of the operation of the memory device 200. FIG. 9 is a flowchart of write processing for increasing resistance performed by the memory device 200 on a memory cell 11 in the excessively low resistance state (hereinafter, excessively low resistance cell).

It should be noted that the control circuit 209 sets the resistance value of the load resistor 121 to the first resistance value during normal write processing and normal read processing. Further, when normal write processing is performed, the control circuit 209 reversibly changes the variable resistance element 105 between the LR state and the HR state, by applying a voltage pulse to the series circuit including the memory cell 11 and the load resistor 121 having the first resistance value.

First, the control circuit 209 detects an excessively low resistance cell that is a defective bit (S101).

For example, when it is determined whether the memory cell 11 is an excessively low resistance cell, the control circuit 209 measures the resistance value in the state where the load resistor 121 having the first resistance value is connected to the memory cell 11.

Next, the control circuit 209 determines whether the resistance value measured in the above state is smaller than a value at the LR level by a predetermined value or more. For example, the control circuit 209 determines that the memory cell 11 is an excessively low resistance cell, when the resistance value measured in the above state is a value at the LR level×70% or less.

Further, the above step S101 is performed at the time of, for example, a verifying operation performed in the normal writing processing. Specifically, the above step S101 is performed by the control circuit 209 controlling the sense amplifier 206.

When the memory cell 11 on which processing is to be performed is not an excessively low resistance cell (No in S102), the control circuit 209 determines that the memory cell 11 on which processing is to be performed is normal, and ends processing.

On the other hand, when it is determined that the memory cell 11 on which processing is to be performed is an excessively low resistance cell (Yes in S102), the control circuit 209 switches the resistance value of the load resistor 121 connected to the memory cell 11 from the first resistance value to the second resistance value that is smaller than the first resistance value, by controlling the variable load resistance circuit 211 (S103). For example, the first resistance value is 5000Ω, and the second resistance value is 1000Ω. This is for effectually increasing the voltage to be applied to the variable resistance element 105, as described above.

Subsequently, the control circuit 209 causes the excessively low resistance cell to shift to the second high resistance state having a resistance value greater than that of the LR state, by applying a voltage pulse to the series circuit including the excessively low resistance cell and the load resistor 121 having the second resistance value.

Specifically, by controlling the write circuit 205, the control circuit 209 applies, to both ends of the series circuit including the memory cell 11 and the load resistor 121 having the second resistance value, a second resistance-increasing write voltage pulse of +6 to 10V and with a pulse width of 500 ns, for example (S104).

Next, the control circuit 209 determines, by controlling the sense amplifier 206, whether or not the excessively low resistance cell is in the second high resistance state due to step S104 (S105). For example, it is determined whether the resistance value of the memory cell 11 to which the above pulse has been applied is greater than the value at the LR level.

When the resistance value of the memory cell 11 to which the above pulse has been applied is smaller than the value at the LR level (No in S106), the control circuit 209 switches the resistance value of the load resistor 121 to the still smaller third resistance value, by controlling the variable load resistance circuit 211 (S109). Then, the control circuit 209 applies the voltage pulse to the series circuit including the excessively low resistance cell and the load resistor 121 having the third resistance value by controlling the write circuit 205, thereby repeating the processing for causing the excessively low resistance cell to shift to the second high resistance state (S104). For example, the third resistance value is 100Ω.

On the other hand, when the resistance value of the memory cell 11 to which the above pulse has been applied is greater than the value at the LR level (Yes in S106), namely, when the excessively low resistance cell is in the second high resistance state, the control circuit 209 changes the resistance value of the load resistor 121 back to the first resistance value (5000Ω) again, by controlling the variable load resistance circuit 211 (S107).

It should be noted that the level for determination made after the resistance-increasing write processing in the above step S105 may be set to a still greater resistance value, such as a value at the HR level (resistance value of the HR state) or greater or a value at a level higher than the HR level by one digit or more. In other words, the resistance value of the above second high resistance state may be a value at a level higher than the HR level, or a value at a level higher than the HR level by one digit or more. In this manner, a leak current due to a defective memory cell decreases, which achieves effects such as improvement in the margin of a read operation and reduction of write disturb.

The control circuit 209 determines that the memory cell 11 whose resistance has been increased as described above is a defective bit. Also, the control circuit 209 stores information for specifying the defective bit in a redundant circuit (not shown), and replaces that defective bit with a normal memory cell (S108).

By performing the above processing, the nonvolatile memory device 200 according to Embodiment 2 of the present invention detects a memory cell 11 (excessively low resistance cell) in which a defect has occurred when the diode 112 substantially becomes short-circuited. Furthermore, the nonvolatile memory device 200 decreases the resistance value of the load resistor 121 to the second resistance value smaller than the first resistance value that is used when a normal operation is performed, and then applies a voltage pulse to the detected excessively low resistance cell, thereby increasing the resistance of that memory cell.

Accordingly, most of the voltage applied to the excessively low resistance cell to increase the resistance is applied to the variable resistance element 105 rather than to the load resistor 121, and thus the resistance of the variable resistance element 105 can be increased. Therefore, the excessively low resistance cell can be brought out of the excessively low resistance state.

Accordingly, when writing to and reading from other memory cells in the same row or column as that having the defective memory cell 11 are performed, although a voltage is also applied to that memory cell 11, an excessive leak current does not flow into the memory cell 11, and thus the other memory cells are allowed to normally operate. Therefore, the performance of the nonvolatile memory device 200 can be improved.

As described above, even when a defect has occurred in a memory cell 11, the nonvolatile memory device 200 according to Embodiment 2 of the present invention can effectively prevent a state in which writing to and reading from other memory cells 11 in the same row or column as that having the defective memory cell 11 cannot be performed.

Although the above has been a description of a nonvolatile memory device and a method for programming the same according to the embodiments of the present invention, the present invention is not limited to those embodiments.

For example, although the above is a description using, as an example, a case in which the memory cells 11 each store only binary data represented by a first logical value corresponding to the first high resistance state and a second logical value corresponding to the first low resistance state, the memory cells 11 may store three or more valued data. In this case, the variable resistance element 105 has a plurality of resistance states respectively corresponding to a plurality of logical values. Then, the excessively low resistance state (second low resistance state) described above is a state having a resistance value smaller than the smallest resistance value of the resistance values of these resistance states.

It should be noted that processing units included in the nonvolatile memory device according to the above embodiments are typically realized as an LSI which is an integrated circuit. These may be individually formed as a single chip, or may be formed as a single chip to include some or all of the units.

Further, circuit integration is not limited to LSIs, and implementation through a dedicated circuit or a general-purpose processor is also possible. A field programmable gate array (FPGA) that allows programming after LSI manufacturing or a reconfigurable processor that allows reconfiguration of the connections and settings of circuit cells inside the LSI may also be used.

Further, some or all of the functions of the nonvolatile memory device according to the embodiments of the present invention may be realized by a processor such as a CPU executing a program.

Furthermore, the present invention may be the above program, or may be a recording medium on which the above program is recorded. Further, it goes without saying that the above program can be distributed via a transmission medium such as the Internet.

Although corners and sides of the constituent elements are linearly illustrated in the drawings described above, elements having roundish corners and sides for a manufacturing reason are also included in the present invention.

At least some of the functions of the nonvolatile memory device according to the above embodiments and modifications thereof may be combined.

All the numbers used above are examples to specifically describe the present invention, and the present invention is not limited to the numbers described as examples. Furthermore, the logical levels expressed by "high" and "low" or the switching states expressed by "ON" and "OFF" are examples to specifically describe the present invention, and it is also possible to obtain an equivalent result using a different combination of the logical levels or the switching states described as examples.

The materials of the constituent elements described above are all examples to specifically describe the present invention, and the present invention is not limited to the materials described as examples.

Further, although an example using a MOS transistor has been described in the above, another transistor such as a bipolar transistor may be used.

Furthermore, the present invention also includes, without departing from the gist of the present invention, various modifications obtained by changing the embodiments within the range that may be conceived by a person skilled in the art.

INDUSTRIAL APPLICABILITY

The present invention is applicable to a nonvolatile memory device and a method for programming the same. Further, the present invention is useful for various electronic devices using a nonvolatile memory device, such as a digital appliance, a memory card, a mobile phone, and a personal computer.

REFERENCE SIGNS LIST

10 Memory cell array (Semiconductor memory device)
11, 280 Memory cell (Nonvolatile memory element)
21, 22 IV curve
100 Substrate
101, 220 Word line (First line)
102 First interlayer insulating layer
103 First contact plug
105, 260 Variable resistance element
106 Lower electrode
107 Variable resistance layer
108 Upper electrode
109 Second interlayer insulating layer
110 Second contact plug
112, 270 Diode
113 Lower electrode
114 Semiconductor layer
115 Upper electrode
116 Third interlayer insulating layer
117 Third contact plug
118 Fourth contact plug
119, 210 Bit line (Second line)
120 Lead line
121 Load resistor
130, 131 Transistor
132 Resistor
200 Nonvolatile memory device (Memory device)
201 Memory body
203 Row selection circuit with driver
204 Column selection circuit with driver
205 Write circuit
206 Sense amplifier
207 Data input/output circuit
208 Address input circuit
209 Control circuit
211 Variable load resistance circuit

The invention claimed is:

1. A method for programming a nonvolatile memory device including a plurality of memory cells each of which includes a diode with a nonlinear current-voltage characteristic and a variable resistance element connected to the diode in series, and a variable load resistor connected to the memory cells in series, the variable resistance element being reversibly changed between a first high resistance state and a first low resistance state by applying a first resistance-decreasing electrical pulse to a series circuit including corresponding one of the memory cells and the variable load resistor having a first resistance value so as to change the variable resistance element from the first high resistance state to the first low resistance state, and by applying a first resistance-increasing electrical pulse to the series circuit so as to change the variable resistance element from the first low resistance state to the first high resistance state, said method comprising:

detecting, from among the memory cells, an excessively low resistance cell including a variable resistance element in a second low resistance state having a resistance value smaller than a resistance value of the first low resistance state;

changing a resistance value of the variable load resistor from the first resistance value to a second resistance value smaller than the first resistance value; and causing the variable resistance element included in the excessively low resistance cell to shift from the second low resistance state to a second high resistance state having a resistance value greater than the resistance value of the first low resistance state, by applying a second resistance-increasing electrical pulse to a series circuit including the excessively low resistance cell and the variable load resistor having the second resistance value.

2. The method for programming a nonvolatile memory device according to claim 1, wherein the resistance value of the second high resistance state is greater than a resistance value of the first high resistance state.

3. The method for programming a nonvolatile memory device according to claim 1, wherein said causing the variable resistance element to shift includes:

applying the second resistance-increasing electrical pulse to the series circuit including the excessively low resistance cell and the variable load resistor having the second resistance value;

reading a resistance value of the excessively low resistance cell after said applying;

determining whether or not the variable resistance element included in the excessively low resistance cell is in the second high resistance state, as a result of said reading;

changing the resistance value of the variable load resistor to a third resistance value smaller than the second resistance value, when it is determined in said determining that the excessively low resistance cell is not in the second high resistance state; and causing the excessively low resistance cell to shift to the second high resistance state by applying the second resistance-increasing electrical pulse to the series circuit including the excessively low resistance cell and the variable load resistor having the third resistance value, and said causing the variable resistance element to shift including from said applying to said causing the excessively low resistance cell to shift is repeated until it is determined in said determining that the variable resistance element included in the excessively low resistance cell is in the second high resistance state.

4. The method for programming a nonvolatile memory device according to claim 1, wherein the variable load resistor includes a transistor, and in said changing of the resistance value to the second resistance value, the resistance value of the variable load resistor is changed to a smaller resistance value by changing a gate voltage of the transistor.

5. The method for programming a nonvolatile memory device according to claim 1, further comprising changing the resistance value of the variable load resistor from a resistance value smaller than the first resistance value to the first resistance value, after said causing the variable resistance element to shift.

6. The method for programming a nonvolatile memory device according to claim 1, wherein each of the memory cells stores only binary data represented by a first logical value corresponding to the first high resistance state and a second logical value corresponding to the first low resistance state.

7. A nonvolatile memory device comprising:

a plurality of first lines arranged parallel to a main surface of a substrate at predetermined intervals in a first direction;

a plurality of second lines arranged parallel to the main surface of the substrate at predetermined intervals in a second direction, so as to three-dimensionally intersect with said first lines;

a memory cell array including a plurality of memory cells each of which includes a diode with a nonlinear current-voltage characteristic and a variable resistance element connected to said diode in series, and has two terminals respectively connected to one of said first lines and one of said second lines, said memory cells being respectively disposed at crosspoints of said first lines and said second lines;

a row selection circuit with a driver and a column selection circuit with a driver that select one of said memory cells included in said memory cell array, and apply a predetermined write voltage and a predetermined read voltage to the selected memory cell;

a sense amplifier that reads a resistance value of the selected memory cell; and a variable load resistor connected to said memory cell array in series, wherein said variable resistance element included in the selected memory cell changes from a first low resistance state to a first high resistance state due to application of a first resistance-increasing electrical pulse to a series circuit including the selected memory cell and said variable load resistor having a first resistance value, and reversibly changes from the first high resistance state to the first low resistance state due to application of a first resistance-decreasing electrical pulse to the series circuit, and said nonvolatile memory device further comprises a control circuit that:

detects, from among said memory cells, an excessively low resistance cell including a variable resistance element in a second low resistance state having a resistance value smaller than a resistance value of the first low resistance state;

changes a resistance value of said variable load resistor from the first resistance value to a second resistance value smaller than the first resistance value; and causes the variable resistance element included in the excessively low resistance cell to shift to a second high resistance state having a resistance value greater than the resistance value of the first low resistance state, by applying a second resistance-increasing electrical pulse to a series circuit including the excessively low resistance cell and said variable load resistor having the second resistance value.

8. The nonvolatile memory device according to claim 7, further comprising:

a recording unit configured to record an address of the excessively low resistance cell caused to shift to the second high resistance state; and at least one spare memory cell, wherein said control circuit has a function of recording the address of the excessively low resistance cell caused to shift to the second high resistance state, and performing control such that an address of said spare memory cell is to be accessed when the address of the excessively low resistance cell is designated at a memory operation performed after the recording.

9. The nonvolatile memory device according to claim 7, wherein the resistance value of the second high resistance state is greater than the resistance value of the first high resistance state.

10. The nonvolatile memory device according to claim 7, wherein said control circuit controls said variable load resistor so as to change the resistance value of said variable load resistor back to the first resistance value, after causing the excessively low resistance cell to shift to the second high resistance state.

* * * * *